(12) United States Patent
Yoda et al.

(10) Patent No.: US 8,378,555 B2
(45) Date of Patent: Feb. 19, 2013

(54) ELECTROMECHANICAL CONVERSION ELEMENT AND ACTUATOR

(75) Inventors: Tadashi Yoda, Nagaokakyo (JP); Toshio Nishimura, Nagaokakyo (JP); Masanaga Nishikawa, Nagaokakyo (JP); Yasuhiro Okamoto, Hachioji (JP); Tomoyuki Yuasa, Hachioji (JP)

(73) Assignees: Murata Manufacturing Co., Ltd., Nagaokakyo-Shi (JP); Konica Minolta Opto, Inc., Hachioji-shi, Tokyo (JP)

( * ) Notice: Subject to any disclaimer, the term of this patent is extended or adjusted under 35 U.S.C. 154(b) by 0 days.

(21) Appl. No.: 13/437,299

(22) Filed: Apr. 2, 2012

(65) Prior Publication Data
US 2012/0187800 A1 Jul. 26, 2012

Related U.S. Application Data

(63) Continuation of application No. PCT/JP2010/068177, filed on Oct. 15, 2010.

(30) Foreign Application Priority Data

Oct. 23, 2009 (JP) ................................. 2009-244421

(51) Int. Cl.
*H01L 41/047* (2006.01)
(52) U.S. Cl. ........................................ 310/328; 310/368
(58) Field of Classification Search .................. 310/328, 310/368
See application file for complete search history.

(56) References Cited

U.S. PATENT DOCUMENTS

| | | | | |
|---|---|---|---|---|
| 5,675,444 A | * | 10/1997 | Ueyama et al. | ............... 359/824 |
| 6,134,057 A | * | 10/2000 | Ueyama et al. | ............... 359/821 |
| 2005/0253483 A1 | | 11/2005 | Okamoto | |
| 2006/0103266 A1 | * | 5/2006 | Okamoto | ....................... 310/328 |
| 2006/0202793 A1 | | 9/2006 | Akahoshi | |
| 2006/0267450 A1 | * | 11/2006 | Matsuki | ........................ 310/309 |
| 2011/0266922 A1 | * | 11/2011 | Uetani et al. | .................. 310/328 |

FOREIGN PATENT DOCUMENTS

| | | |
|---|---|---|
| EP | 1772912 A1 | 4/2007 |
| JP | 56-140633 A | 11/1981 |
| JP | 290134 | 10/1992 |
| JP | 2587406 | 10/1998 |
| JP | 2003-101366 A | 4/2003 |
| JP | 2005-328639 | 11/2005 |

(Continued)

OTHER PUBLICATIONS

PCT/JP2010/068177 International Search Report dated Dec. 28, 2010.

(Continued)

*Primary Examiner* — Walter Benson
*Assistant Examiner* — Bryan Gordon
(74) *Attorney, Agent, or Firm* — Dickstein Shapiro LLP (57) ABSTRACT

An electromechanical conversion element having high connection reliability and an actuator equipped with the electromechanical conversion element. The electromechanical conversion element includes: a displacement part capable of expanding and contracting by application of voltage and having electrode forming faces and an adhesion face which are disposed adjacent to each other; and external electrodes on the electrode forming faces, in which lead electrodes for applying voltage to the displacement part are bonded to bonding regions provided in the external electrodes, and a driven member capable of being driven by the expansion and contraction of the displacement part is bonded to the adhesion face by an adhesive. The electromechanical conversion element further includes bleed flow blocking parts on the electrode forming faces at points closer to the adhesion face than ends of the bonding regions located on the same side as the adhesion face.

15 Claims, 8 Drawing Sheets

FOREIGN PATENT DOCUMENTS

| | | |
|---|---|---|
| JP | 2006-141133 A | 6/2006 |
| JP | 2006-141171 A | 6/2006 |
| JP | 2007-096529 A | 4/2007 |
| JP | 2007-104808 A | 4/2007 |
| JP | 2007-181384 A | 7/2007 |
| JP | 2008-130887 A | 6/2008 |

OTHER PUBLICATIONS

Notification of Transmittal of Translation of the International Preliminary Report on Patentability with Written Opinion of the International Search Authority issued for PCT/JP2010/068177, date of mailing May 24, 2012.

* cited by examiner

ELECTROMECHANICAL CONVERSION ELEMENT AND ACTUATOR

CROSS REFERENCE TO RELATED APPLICATIONS

The present application is a continuation of International application No. PCT/JP2010/068177, filed Oct. 15, 2010, which claims priority to Japanese Patent Application No. 2009-244421, filed Oct. 23, 2009, the entire contents of each of which are incorporated herein by reference.

FIELD OF THE INVENTION

This invention relates to electromechanical conversion elements and actuators equipped with them.

BACKGROUND OF THE INVENTION

Figure 13:
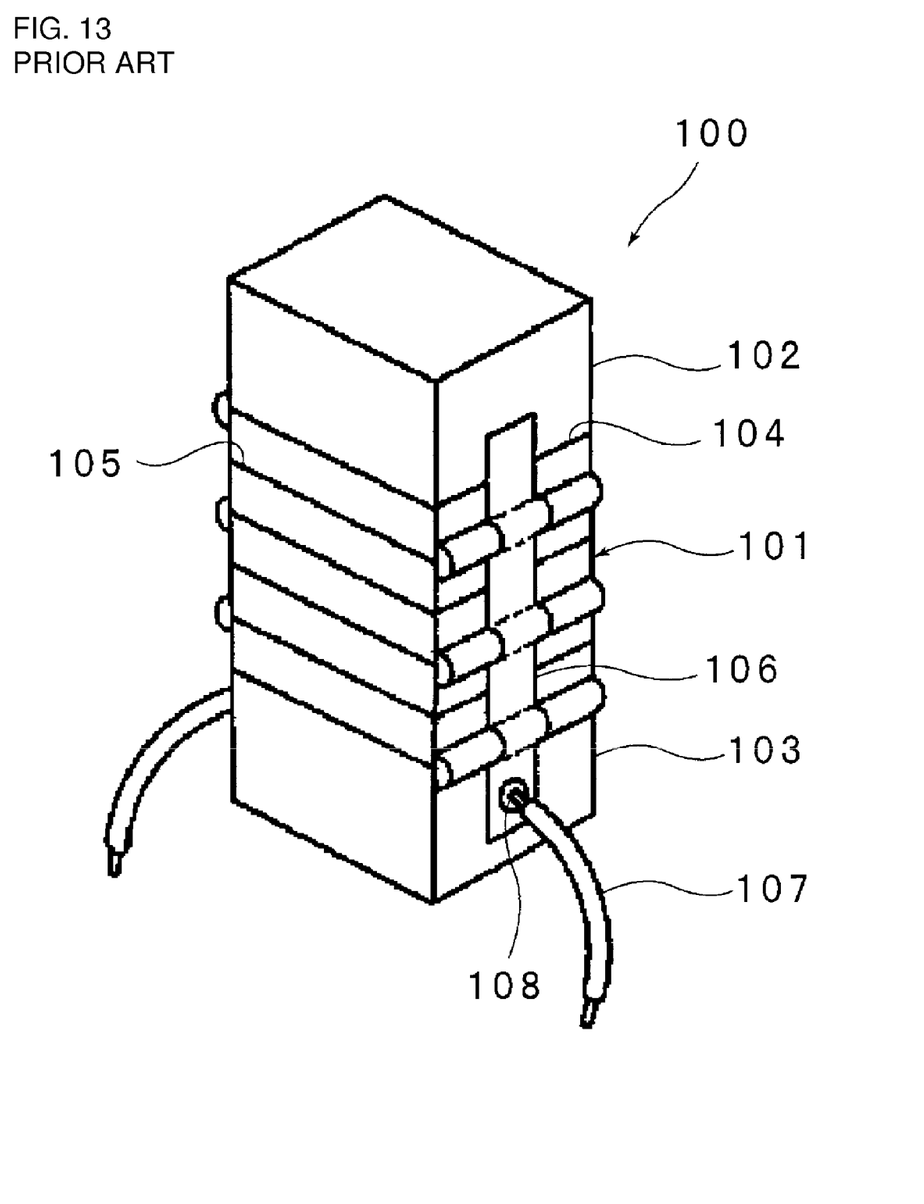
FIG. 13 is a schematic perspective view of the piezoelectric actuator described in Patent Literature 1.

Piezoelectric actuators using a piezoelectric element, such as the one described in Patent Literature 1 below, have heretofore been proposed as small-sized actuators for use in camera autofocus mechanisms, for example. FIG. 13 is a schematic perspective view of a piezoelectric actuator described in Patent Literature 1. As shown in FIG. 13, the piezoelectric actuator 100 includes a piezoelectric ceramic part 101 and non-piezoelectric ceramic parts 102 and 103 connected to both ends of the piezoelectric ceramic part 101. The piezoelectric ceramic part 101 is internally provided with a plurality of pairs of opposing first and second internal electrodes 104 and 105. The first internal electrodes 104 are connected to a first external electrode 106 formed on the outside surface of the piezoelectric ceramic part 101. On the other hand, the second internal electrodes 105 are connected to a second external electrode (not shown) formed on the outside surface of the piezoelectric ceramic part 101. Each of the first external electrode 106 and the second external electrode is connected to an external lead 107 by a solder 108.

In the piezoelectric actuator 100, voltage is applied between each pair of first and second internal electrodes 104 and 105 via the external leads 107, the solders 108, the first external electrode 106, and the second external electrode. Thus, the piezoelectric ceramic part 101 expands and contracts. As a result, the piezoelectric actuator 100 is driven.

Patent Literature 1 describes that in assembling this piezoelectric actuator 100 into a machining apparatus or the like, both ends thereof existing in the non-piezoelectric ceramic parts 102 and 103 are fixed, by an epoxy adhesive, one end to a support member and the other end to a driven member.

Patent Literature 1: Japanese Registered Utility Model No. 2587406

SUMMARY OF THE INVENTION

As described in Patent Literature 1, the bonding of a piezoelectric actuator to a support member or a driven member is generally carried out using an adhesive. Particularly in order to bond a small-sized piezoelectric actuator to a support member or a driven member, no effective bonding means, except for adhesives, has been found under present circumstances.

However, when the piezoelectric actuator is bonded to the support member or the driven member using an adhesive, a low molecular weight component in the adhesive, such as a plasticizer or a hardener, will bleed out during curing of the adhesive (hereinafter, such a component having bled out from the adhesive is referred to as a "bleed"). The bleed spreads along the surface of the piezoelectric actuator 100. Therefore, when bleeding occurs, the surfaces of the first external electrode 106 and the second external electrode may be covered with a bleed. In this case, the bonding strength of the solders 108 to the first external electrode 106 and the second external electrode will be decreased. Thus, the reliability of connection of the external leads 107 to the first external electrode 106 and the second external electrode is reduced. Furthermore, if the first external electrode 106 and the second external electrode are covered with a bleed, the solders 108 may be unbondable.

The present invention has been made in view of the foregoing points, and therefore an object thereof is to provide an electromechanical conversion element having high connection reliability and an actuator equipped with the electromechanical conversion element.

An electromechanical conversion element according to the present invention includes a displacement part and an external electrode. The displacement part expands and contracts by application of voltage. The displacement part has an electrode forming face and an adhesion face which are disposed adjacent to each other. The external electrode is formed on the electrode forming face. A lead electrode for applying voltage to the displacement part is bonded to a bonding region provided in the external electrode. A driven member capable of being driven by the expansion and contraction of the displacement part is bonded to the adhesion face by an adhesive. The electromechanical conversion element according to the present invention further includes a bleed flow blocking part provided on the electrode forming face at a point closer to the adhesion face than an end of the bonding region located on the same side as the adhesion face.

In a particular aspect of the electromechanical conversion element according to the present invention, the critical surface tension of the bleed flow blocking part is smaller than that of the external electrode. In this case, the bleed flow blocking part more effectively prevents a bleed having bled out from the adhesive from flowing toward the external electrode. Thus, the bonding strength between the external electrode and the solder can be further increased. As a result, the connection reliability between the lead electrode and the external electrode can be further increased. Furthermore, since the bleed is less likely to enter between the external electrode and the solder, it can be more effectively prevented that the electrical resistance between the external electrode and the solder is increased.

In another particular aspect of the electromechanical conversion element according to the present invention, the critical surface tension of the bleed flow blocking part is within the range of 10 to 100 dyn/cm, both inclusive. In this case, the bleed flow blocking part still more effectively prevents a bleed having bled out from the adhesive from flowing toward the external electrode.

In still another particular aspect of the electromechanical conversion element according to the present invention, the bleed flow blocking part is made of a resin.

In still another particular aspect of the electromechanical conversion element according to the present invention, the bleed flow blocking part is made of an epoxy resin, and acrylic resin, or an urethane resin.

In still another particular aspect of the electromechanical conversion element according to the present invention, the bleed flow blocking part is formed at a distance from an edge of the electrode forming face close to the adhesion face. In this configuration, the bleed flow blocking part still more effectively prevents a bleed having bled out from the adhesive from flowing toward the external electrode.

In still another particular aspect of the electromechanical conversion element according to the present invention, the bleed flow blocking part is formed at a distance of 50 μm or more from the edge of the electrode forming face close to the adhesion face. In this configuration, it can be prevented that upon formation of the bleed flow blocking part by screen printing, ink-jet printing or like methods, print misalignment occurs and a paste or ink for forming the bleed flow blocking part flows around to the adhesion face.

In still another particular aspect of the electromechanical conversion element according to the present invention, the height of the bleed flow blocking part is 1 μm or more. In this configuration, the bleed flow blocking part still more effectively prevents a bleed having bled out from the adhesive from flowing toward the external electrode.

In still another particular aspect of the electromechanical conversion element according to the present invention, as viewed in a direction of the normal of the electrode forming face, the external electrode is formed across a part of the dimension of the electrode forming face in a direction parallel to the adhesion face, and the bleed flow blocking part is formed to traverse at least the region of the electrode forming face in which the external electrode is formed. In this configuration, the bleed flow blocking part still more effectively prevents a bleed having bled out from the adhesive from flowing toward the external electrode.

In still another particular aspect of the electromechanical conversion element according to the present invention, the bleed flow blocking part is formed from one end of the electrode forming face in a direction of extension of the adhesion face to the other end thereof. In this configuration, the bleed flow blocking part still more effectively prevents a bleed having bled out from the adhesive from flowing toward the external electrode.

In still another particular aspect of the electromechanical conversion element according to the present invention, the bleed flow blocking part is formed to surround at least part of the external electrode. In this configuration, the bleed flow blocking part more effectively prevents a bleed having bled out from the adhesive from flowing into the region of the external electrode surrounded by the bleed flow blocking part.

In still another particular aspect of the electromechanical conversion element according to the present invention, the displacement part is formed in the shape of a quadrangular prism that has first and second side faces extending along a height direction and a first direction perpendicular to the height direction, third and fourth side faces extending along the height direction and a second direction perpendicular to the height direction and the first direction, and first and second end faces extending along the first and second directions, the adhesion face is formed of the first end face, and the electrode forming face is formed of the first side face.

In still another particular aspect of the electromechanical conversion element according to the present invention, the displacement part is made of a piezoelectric material.

An actuator according to the present invention includes: the electromechanical conversion element according to the present invention; a driven member bonded to the adhesion face of the electromechanical conversion element by an adhesive; and a lead electrode connected to the external electrode by a solder.

In a particular aspect of the actuator according to the present invention, the actuator further includes a movable body frictionally slidably provided on the driven member, wherein the movable body is configured to be slidingly displaced relative to the driven member by moving the driven member using the expansion and contraction of the electromechanical conversion element.

In the present invention, the electromechanical conversion element includes a bleed flow blocking part provided on the electrode forming face at a point closer to the adhesion face than an end of the bonding region for the lead electrode located on the same side as the adhesion face. Therefore, the bleed flow blocking part blocks a bleed from the adhesive applied to the adhesion face from flowing into the bonding region. As a result, the bonding region is less likely to be covered with the bleed. Therefore, the connection reliability between the external electrode and the lead electrode can be increased.

DETAILED DESCRIPTION OF THE PREFERRED EMBODIMENTS

Hereinafter, a preferred embodiment of the present invention will be described. However, the following embodiment is merely illustrative. The present invention is not intended to be limited to the following embodiment.

First Embodiment

Figure 1:
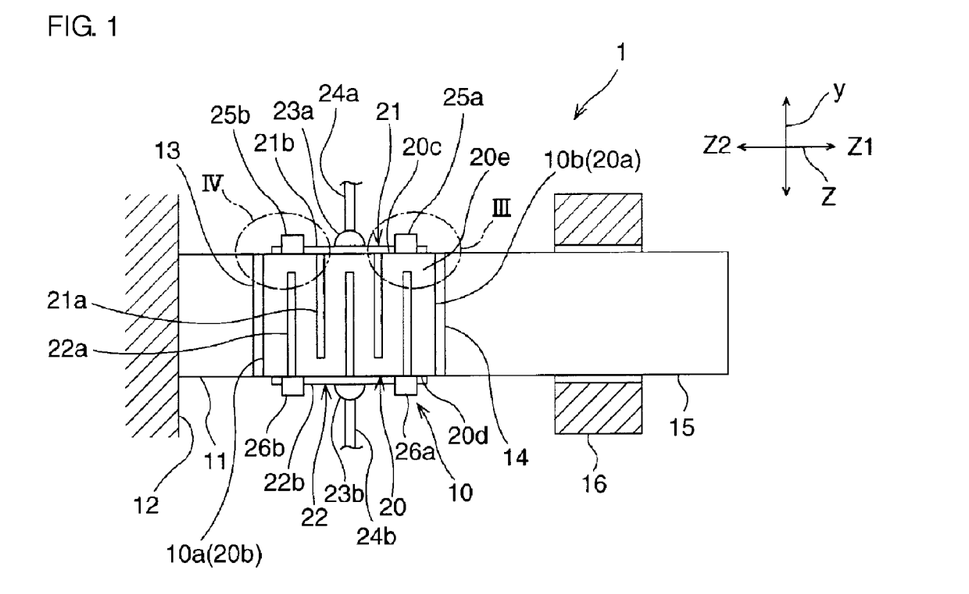
FIG. 1 is a schematic front view of an actuator according to a first embodiment.
Figure 2:
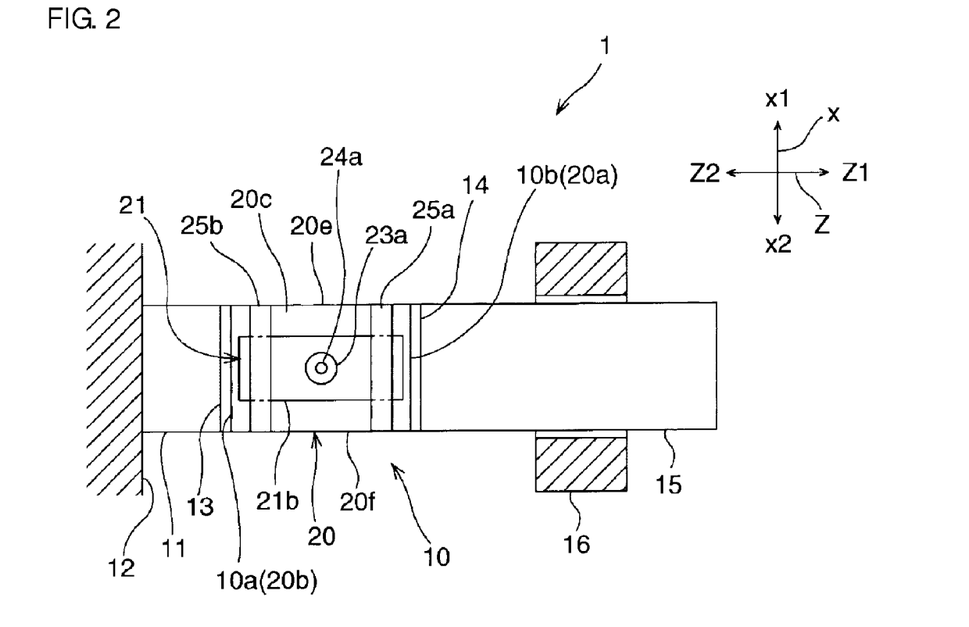
FIG. 2 is a schematic side view of the actuator according to the first embodiment.

FIG. 1 is a schematic front view of an actuator according to a first embodiment. FIG. 2 is a schematic side view of the actuator according to the first embodiment.

As shown in FIGS. 1 and 2, a piezoelectric actuator 1 includes an approximately rectangular prism-shaped electromechanical conversion element 10. The electromechanical conversion element 10 is an element that can expand and contract in the height direction Z by application of voltage. The electromechanical conversion element 10 can be driven to differ in speed between expansion and contraction by controlling the application of voltage to the electromechanical conversion element 10.

One end face 10a of the electromechanical conversion element 10 is connected through a weight 11 to a stationary member 12. The weight 11 and the electromechanical conversion element 10 are bonded together by an adhesive layer 13. Likewise, the weight 11 and the stationary member 12 are also bonded together by an unshown adhesive layer.

The stationary member 12 is composed of a housing of an apparatus onto which the piezoelectric actuator is to be mounted or a member fixed to the housing.

The provision of the weight 11, which is a member for efficiently transmitting vibrations of the piezoelectric actuator 1 to the driven member, offers a greater driving force. However, the weight 11 may not necessarily be provided.

No particular limitation is placed on the type of the weight 11, so long as it has a higher density than a displacement part 20 to be described later, for example. The weight 11 can be formed from a metal or an alloy, for example.

The other end face 10b of the electromechanical conversion element 10 is bonded to a driven member 15 by an adhesive layer 14. The driven member 15 is formed in an approximately cylindrical shape. The driven member 15 is provided with a movable body 16 capable of frictional sliding on the driven member 15. The driven member 15 is frictionally slidably inserted into the movable body 16. The shape of the driven member 15 is not limited to the approximately cylindrical shape, so long as it can frictionally slide in the movable body 16. For example, the driven member 15 may be formed in the shape of a prism.

In the piezoelectric actuator 1, when upon rapid movement of the driven member 15 the inertial force of the movable body 16 is greater than the force of frictional engagement between the movable body 16 and the driven member 15, the movable body 16 is slidingly displaced relative to the driven member 15. For example, assume that the electromechanical conversion element 10 is vibrated asymmetrically so that it moves rapidly toward the Z1 side and moves slowly toward the Z2 side. When in this case the inertial force of the movable body 16 is greater than the force of frictional engagement thereof with the driven member 15, the movable body 16 upon rapid movement of the electromechanical conversion element 10 toward the Z1 side slides relative to the driven member 15 and its absolute position remains substantially unchanged. In contrast, upon slow movement of the electromechanical conversion element 10 toward the Z2 side, the movable body 16 moves toward the Z2 side together with the driven member 15. The repetition of this vibration allows the movable body 16 to gradually move toward the Z2 side.

Figure 3:
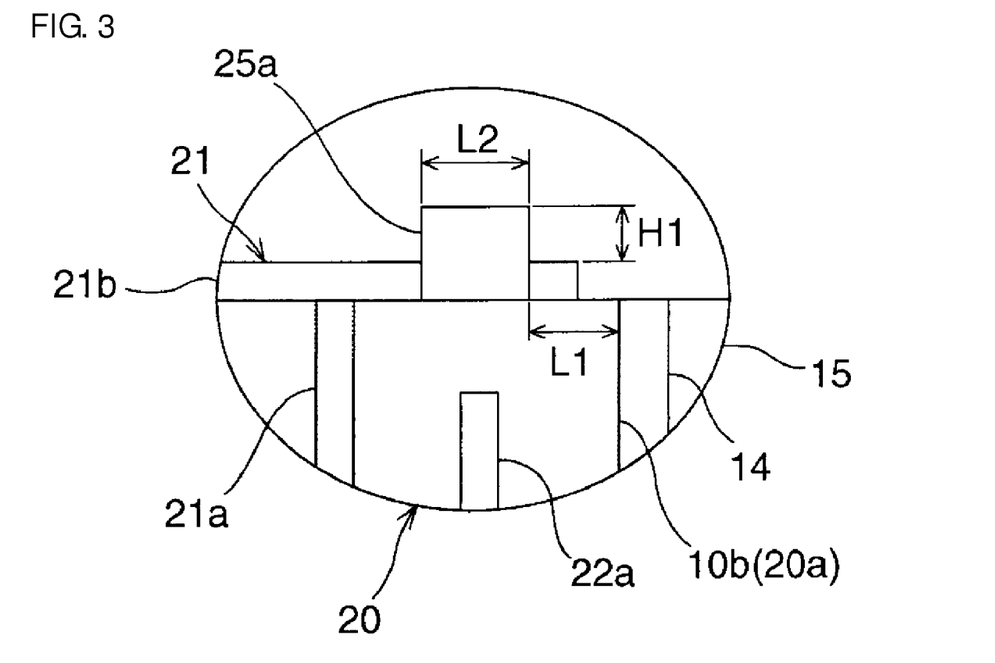
FIG. 3 is a schematic enlarged view of the part III shown in FIG. 1.

Next, a description is given of the structure of the electromechanical conversion element 10 with reference to FIGS. 1 to 3. No particular limitation is placed on the dimensions of the electromechanical conversion element 10. For example, the dimension of the electromechanical conversion element 10 along the height direction Z can be 0.3 mm to 3 mm, both inclusive.

As shown in FIGS. 1 and 2, the electromechanical conversion element 10 includes a displacement part 20. The displacement part 20 expands and contracts by application of voltage. In this embodiment, the displacement part 20 is made of a piezoelectric material. An example of the piezoelectric material is a piezoelectric ceramic. Specific examples of the piezoelectric ceramic include lead zirconate titanate (PZT) based ceramics.

The displacement part 20 is formed in the shape of a rectangular prism. The term "rectangular prism" herein includes rectangular prisms in which their corners and at least portions of their edges are chamfered or rounded. More specifically, a "rectangular prism" means a three-dimensional body having a pair of end faces, first and second side faces perpendicular to the pair of end faces, and third and fourth side faces perpendicular to both the first and second side faces.

The displacement part 20 has first and second end faces 20a and 20b, and first to fourth side faces 20c to 20f. Each of the first and second end faces 20a and 20b extends along the first direction x and second direction y both of which are perpendicular to the height direction Z. Each of the first and second side faces 20c and 20d extends along the height direction Z and the first direction x. Each of the third and fourth directions 20e and 20f extends along the height direction Z and the second direction y. Each of the first to fourth side faces 20c to 20f adjoins the first and second end faces 20a and 20b. In this embodiment, the first and second end faces 20a and 20b of the displacement part 20 constitute the end faces 10b and 10a, respectively, of the electromechanical conversion element 10. In other words, the first end face 20a constitutes an adhesion face to which the driven member 15 is bonded by an adhesive. The second end face 20b constitutes an adhesion face to which the weight 11 is bonded by an adhesive. However, the second end face 20b may be bonded directly to the stationary member 12 by an adhesive.

As shown in FIG. 1, the electromechanical conversion element 10 includes first and second electrodes 21 and 22. These first and second electrodes 21 and 22 are electrodes for applying voltage to the displacement part 20. The first electrode 21 includes a plurality of first internal electrode parts 21a and a first external electrode part 21b. The second electrode 22 includes a plurality of second internal electrode parts 22a and a second external electrode part 22b. However, the present invention is not limited to this structure. For example, the first and second electrodes 21 and 22 may have only first and second external electrode parts 21b and 22b but no first and second internal electrode parts 21a and 22a.

The plurality of first internal electrode parts 21a and the plurality of second internal electrode parts 22a are formed inside the displacement part 20. Each of the first and second internal electrode parts 21a and 22a is disposed along the first and second directions x and y. The first and second internal electrode parts 21a and 22a are alternately arranged in the height direction Z. The first internal electrode parts 21a are exposed on the first, third, and fourth side faces 20c, 20e, and 20f, except for the second side face 20d. On the other hand, the second internal electrode parts 22a are exposed on the second to fourth side faces 20d, 20e, and 20f, except for the first side face 20c.

The first internal electrode parts 21a are connected to the first external electrode part 21b. The first external electrode part 21b is formed on the first side face 20c. On the other hand, the second internal electrode parts 22a are connected to the second external electrode part 22b. The second external electrode part 22b is formed on the second side face 20d. Therefore, in this embodiment, the first and second side faces 20c and 20d constitute external electrode forming faces.

The plan shape of each of the first and second external electrode parts 21b and 22b is an approximately rectangular shape extending along the height direction Z. In this embodiment, the first and second external electrode parts 21b and 22b are formed, for example, across respective parts of the dimensions of the first and second side faces 20c and 20d in the direction x. The first and second external electrode parts 21b and 22b may be formed, for example, all along the dimensions of the first and second side faces 20c and 20d in the height direction Z. However, the first and second external electrode parts 21b and 22b may be formed over the entire areas of the first and second side faces 20c and 20d.

No particular limitation is placed on the material forming the first and second electrodes 21 and 22 so long as it is an electrically conducting material. The first and second electrodes 21 and 22 are formed, for example, from a metal, such as Ag, Cu, Pt, Au, Ni, Cr, or Pd, or an alloy containing at least one of these metals as a main component. A specific example of the alloy is an Ag—Pd alloy. Each of the first and second electrodes 21 and 22 may be composed of a laminate of a plurality of electrically conducting layers. For example, each of the first and second electrodes 21 and 22 may be composed of a laminate of an Ag layer and a NiCr layer.

No particular limitation is also placed on the method for forming the first and second electrodes 21 and 22. Each of the first and second internal electrode parts 21a and 22a may be formed, for example, by applying an electrically conductive paste onto a ceramic green sheet and firing it. Each of the first and second external electrode parts 21b and 22b may be formed, for example, using an electrically conductive paste or by a thin film formation process, such as sputtering or vapor deposition. Alternatively, the first and second external electrode parts 21b and 22b may be formed by plating.

The first and second external electrode parts 21b and 22b are provided with their respective lead bonding regions. The lead bonding regions are connected to lead electrodes 24a and 24b by solders 23a and 23b. Voltage is applied between the first and second electrodes 21 and 22 through the lead electrodes 24a and 24b and the solders 23a and 23b to drive the electromechanical conversion element 10. The connection of the lead electrodes 24a and 24b may be implemented, for example, by an electrically conductive adhesive.

Figure 5:
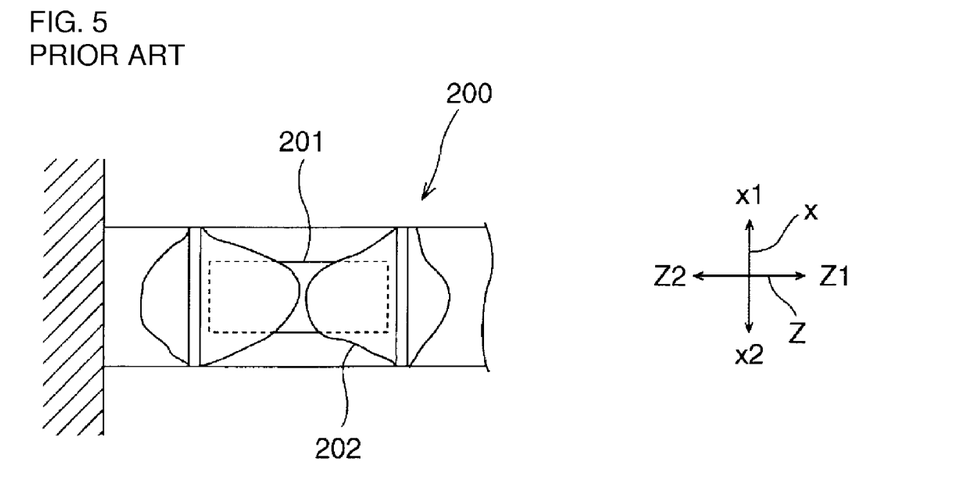
FIG. 5 is a schematic view showing a state that in an actuator of a reference example in which no bleed flow blocking part is provided, adhesives have caused bleeding.

When the electromechanical conversion element 11 is bonded to the weight 11 or the driven member 15 by an adhesive, a low molecular weight component in the adhesive, such as a plasticizer, bleeds out during curing of the adhesive. A bleed having bled out from the adhesive spreads along the surface of the electromechanical conversion element. Therefore, for example, in an electromechanical conversion element 200 to be described later provided with no bleed flow blocking parts as shown in FIG. 5, bleeds 202 will spread even onto an external electrode part 201. As a result, the surface of the external electrode part 201 may be covered with the bleeds 202. In this case, since the bleeds 202 are organic components as described previously, the bondability of the solder to the external electrode part 201 will be reduced. Thus, the solder may not bond to the external electrode part 201, or if it does, it may not be able to obtain sufficiently large bonding strength. Therefore, the reliability of connection of the lead electrode to the external electrode part 201 will be reduced. Furthermore, the electric resistance between the external electrode part 201 and the solder may be increased.

By contrast, in this embodiment, as shown in FIGS. 1 to 3, the first and second side faces 20c and 20d constituting the electrode forming faces are provided with bleed flow blocking parts 25a, 25b, 26a, and 26b extending along the first direction x.

Figure 6:
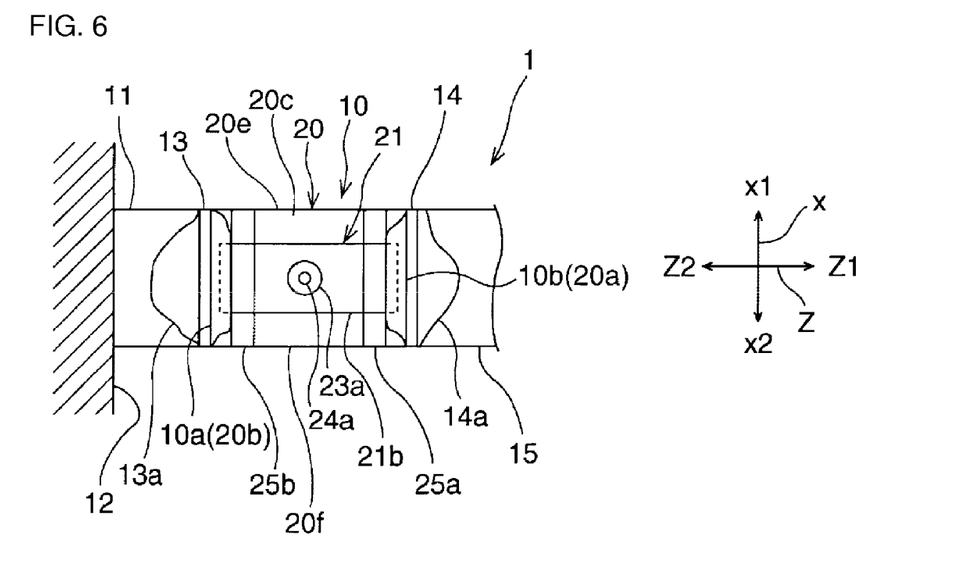
FIG. 6 is a schematic view showing a state that in the actuator according to the first embodiment, adhesives have caused bleeding.

Specifically, the bleed flow blocking parts 25a and 26a are provided on the first and second external electrode parts 21b and 22b, respectively, at points closer to the first end face 20a than the ends of the first and second external electrode parts 21b and 22b located opposite the first end face 20a. In other words, the bleed flow blocking parts 25a and 26a are provided closer to the Z1 side of the height direction Z than the ends of the first and second external electrode parts 21b and 22b located on the Z2 side of the height direction Z. More specifically, the bleed flow blocking parts 25a and 26a are provided closer to the first end face 20a than the ends of the bonding regions for the lead electrodes 24a and 24b located on the same side as the first end face 20a. Therefore, as shown in FIG. 6, it can be prevented that a bleed 14a from the adhesive layer 14, which bonds the displacement part 20 and the driven member 15 together, flows over the bleed flow blocking parts 25a and 26a toward the Z2 side of the height direction Z. Hence, it can be prevented that the portions of the surfaces of the first and second external electrode parts 21b and 22b located closer to the Z2 side of the height direction Z than the bleed flow blocking parts 25a and 26a are covered with the bleed 14a.

Furthermore, in this embodiment, the bleed flow blocking parts 25a and 26a are formed to traverse in the first direction x at least the respective regions of the first and second side faces 20c and 20d in which the first and second external electrode parts 21b and 22b are formed. Therefore, it can be more effectively prevented that the portions of the surfaces of the first and second external electrode parts 21band 22b located closer to the Z2 side of the height direction Z than the bleed flow blocking parts 25a and 26a are covered with the bleed 14a.

Moreover, in this embodiment, the bleed flow blocking parts 25a and 26a are formed from the respective ends of the first and second side faces 20c and 20d on the x1 side of the first direction x to the respective ends thereof on the x2 side of the first direction x. Therefore, it can be still more effectively prevented that the portions of the surfaces of the first and second external electrode parts 21b and 22b located closer to the Z2 side of the height direction Z than the bleed flow blocking parts 25a and 26a are covered with the bleed 14a.

On the other hand, the bleed flow blocking parts 25b and 26b are provided, as shown in FIGS. 1 to 3 and FIG. 6, on the first and second external electrode parts 21b and 22b, respectively, at points closer to the second end face 20b than the ends of the first and second external electrode parts 21b and 22b located toward the first end face 20a. In other words, the bleed flow blocking parts 25b and 26b are provided closer to the Z2 side of the height direction Z than the ends of the first and second external electrode parts 21b and 22b located on the Z1 side of the height direction Z. Therefore, as shown in FIG. 6, it can be prevented that a bleed 13a from the adhesive layer 13, which bonds the displacement part 20 and the weight 11 together, flows over the bleed flow blocking parts 25b and 26b toward the Z1 side of the height direction Z. Hence, it can be prevented that the portions of the surfaces of the first and second external electrode parts 21b and 22b located closer to the Z1 side of the height direction Z than the bleed flow blocking parts 25b and 26b are covered with the bleed 13a.

Furthermore, in this embodiment, the bleed flow blocking parts 25b and 26b are formed to traverse in the first direction x at least the respective regions of the first and second side faces 20c and 20d in which the first and second external electrode parts 21b and 22b are formed. Therefore, it can be more effectively prevented that the portions of the surfaces of the first and second external electrode parts 21b and 22b located closer to the Z1 side of the height direction Z than the bleed flow blocking parts 25b and 26b are covered with the bleed 13a.

Moreover, in this embodiment, the bleed flow blocking parts 25b and 26b are formed from the respective ends of the first and second side faces 20c and 20d on the x1 side of the first direction x to the respective ends thereof on the x2 side of the first direction x. Therefore, it can be still more effectively prevented that the portions of the surfaces of the first and second external electrode parts 21b and 22b located closer to the Z1 side of the height direction Z than the bleed flow blocking parts 25b and 26b are covered with the bleed 13a.

As described so far, in this embodiment, since the bleed flow blocking parts 25a, 25b, 26a, and 26b are provided, it is prevented that the portion of the first external electrode part 21b located between the bleed flow blocking parts 25a and 25b and the portion of the second external electrode part 22b located between the bleed flow blocking parts 26a and 26b are covered with the bleeds 13a and 14a. Thus, it can be prevented that the solders 23a and 23b (see FIG. 1) are reduced in bondability to the first and second external electrode parts 21b and 22b, respectively. In other words, the first and second external electrode parts 21b and 22b can be firmly bonded to the solders 23a and 23b, respectively. This ensures high reliability of connection of the lead electrodes 24a and 24b to the first and second external electrode parts 21b and 22b. Furthermore, it can be prevented that the electrical resistance between the first and second external electrode parts 21b and 22b and the respective associated solders 23a and 23b is increased. This provides a high driving efficiency of the piezoelectric actuator 1.

The above effects can be obtained regardless of the material of the displacement part 20. However, when the displacement part 20 is made of ceramics, the bleeds 13a and 14a will be more likely to spread along the surface of the displacement part 20. Therefore, when the displacement part 20 is made of ceramics, the above effects can be more significantly exhibited. The reason why the displacement part 20 made of ceramics allows the bleeds 13a and 14a to easily spread along the surface thereof can be attributed to the fact that the ceramic surface is microscopically porous and a high affinity exists between the adsorbed water on the ceramic surface and the bleed component.

The effect of preventing the coverage of the external electrode part surfaces with bleeds, which can be obtained in this embodiment, can also be obtained when the electromechanical conversion element 10 has a large size, such as when the dimension of the electromechanical conversion element 10 in the height direction Z is 10 mm or more. However, this effect is particularly significant when the electromechanical conversion element 10 has a small size. Specifically, the effect is significant, for example, when the dimension of the electromechanical conversion element 10 in the height direction Z is not more than 3 mm.

The bleed flow blocking parts 25a, 25b, 26a, and 26b may be made of any material and may have any shape, so long as they protrude in the second direction y from the first and second side faces 20c and 20d. The reason for this is that by providing bleed flow blocking parts 25a, 25b, 26a, and 26b protruding in the second direction y from the first and second side faces 20c and 20d, the flow of bleeds 13a and 14a can be physically prevented.

However, from the viewpoint of more effectively preventing the flow of the bleeds 13a and 14a, the bleed flow blocking parts 25a, 25b, 26a, and 26b should preferably be those that can repel the bleeds 13a and 14a. Specifically, the bleed flow blocking parts 25a, 25b, 26a, and 26b are preferably those that can repel the bleeds 13a and 14a more strongly than the first and second side faces 20c and 20d and the first and second external electrode parts 21b and 22b. Therefore, it is preferred that the bleed flow blocking parts 25a, 25b, 26a, and 26b have a smaller critical surface tension against the bleeds 13a and 14a than the first and second side faces 20c and 20d and the first and second external electrode parts 21b and 22b. It can be considered that the critical surface tension against the bleeds 13a and 14a is substantially equal to that against alkanes.

Specifically, the critical surface tension of the bleed flow blocking parts 25a, 25b, 26a, and 26b against the bleeds 13a and 14a is preferably not more than 100 dyn/cm and more preferably not more than 60 dyn/cm.

As described previously, from the viewpoint of more effectively preventing the flow of the bleeds 13a and 14a, the bleed flow blocking parts 25a, 25b, 26a, and 26b should preferably have a small critical surface tension against the bleeds 13a and 14a. However, if the critical surface tension of the bleed flow blocking parts 25a, 25b, 26a, and 26b is too small, the film strength of the blocking parts may be reduced. Therefore, the critical surface tension of the bleed flow blocking parts 25a, 25b, 26a, and 26b is preferably not less than 10 dyn/cm and more preferably not less than 25 dyn/cm.

No particular limitation is placed on the material forming the bleed flow blocking parts 25a, 25b, 26a, and 26b, and examples of the material include resins, metals, alloys, ceramics, and their composites. Preferably, the bleed flow blocking parts 25a, 25b, 26a, and 26b are made of a resin. In this case, the preferred critical surface tension described above can be easily achieved and the bleed flow blocking parts can be easily formed.

Specific examples of suitable resins for forming the bleed flow blocking parts 25a, 25b, 26a, and 26b include epoxy resins, acrylic resins, and urethane resins. Of the above resins, the particularly preferred are epoxy resins. The reason for this is that when the bleed flow blocking parts 25a, 25b, 26a, and 26b are formed from an epoxy resin, they can be more firmly fixed to the displacement part 20.

Furthermore, the preferred resin for forming the bleed flow blocking parts 25a, 25b, 26a, and 26b is an energy ray curable resin that can be cured by exposure to energy rays. The reason for this is that the bleed flow blocking parts 25a, 25b, 26a, and 26b can be easily formed. Examples of the energy ray curable resin include thermosetting resins and photo-curable resins. Specific examples of thermosetting resins include one-component thermosetting epoxy resins. The one-component thermosetting epoxy resins herein mean resins in which a hardener encapsulated in microcapsules is added to an epoxy resin serving as a base compound. In the case of one-component thermosetting epoxy resins, the microcapsules are broken by application of heat, so that the hardener in the microcapsules reacts with the epoxy resin serving as a base compound to promote curing. The type of thermosetting epoxy resin for use is not limited to the above type containing a hardener encapsulated in microcapsules, and other examples of thermosetting epoxy resins that can be used include two-component thermosetting epoxy resins that can be cured by mixture of two components composed of a base compound and a hardener, and epoxy resins that can be cured at room temperature.

When the bleed flow blocking parts 25a, 25b, 26a, and 26b are formed from a resin, they can be formed, for example, by ink-jet printing or screen printing.

The phrase "formed from a resin" herein includes the case where the bleed flow blocking parts are formed from a resin composition in which an additive, such as a filler, is added to a resin.

No particular limitation is placed on the positions at which the bleed flow blocking parts 25a and 26a are formed, so long as they are closer to the Z1 side of the height direction Z than the ends of the first and second external electrode parts 21b and 22b located on the Z2 side of the height direction Z. For example, the bleed flow blocking parts 25a and 26a may be formed to adjoin the edges of the first and second side faces 20c and 20d located on the Z1 side of the height direction Z. However, the bleed flow blocking parts 25a and 26a are preferably formed at a distance from the edges of the first and second side faces 20c and 20d located on the Z1 side of the height direction Z. Particularly, the bleed flow blocking parts 25a and 26a are preferably formed at points 50 μm or more spaced apart from the edges of the first and second side faces 20c and 20d located on the Z1 side of the height direction Z, and more preferably formed at points 100 μm or more spaced apart from the edges thereof. In other words, as shown in FIG. 3, the distance L1 between each of the bleed flow blocking parts 25a and 26a and the first end face 20a is preferably 50 μm or more and more preferably 100 μm or more. In such a case, since the bleed flow blocking parts 25a and 26a are spaced apart from the first end face 20a, it can be prevented that upon formation of the bleed flow blocking parts by screen printing, ink-jet printing or like methods, print misalignment occurs and a paste or ink for forming the bleed flow blocking parts flows around to the end face 20a. This provides the effect of preventing, upon bonding of a drive shaft or the like to the adhesion face, inclination of the drive shaft or the like and reduction in bonding strength due to flow of the bleed flow blocking parts to the adhesion face. However, if the distance L1 between each of the bleed flow blocking parts 25a and 26a and the first end face 20a is increased, the lead bonding regions of the first and second external electrode parts 21b and 22b will be reduced. In order to enable the lead bonding work to be easily carried out, the distance L1 is preferably selected so that the width of the lead bonding regions is 0.4 mm or more.

No particular limitation is also placed on the heights H1 and H2 of the bleed flow blocking parts 25a, 25b, 26a, and 26b along the second direction y from the first and second external electrode parts 21b and 22b. The heights H1 and H2 are preferably 1 μm or more. For example, when the heights H1 and H2 are within the range of 1 μm to 50 μm, both inclusive, the flow of bleeds can be blocked and simultaneously the bleed flow blocking parts 25a, 25b, 26a, and 26b can be prevented from dropping. If the heights H1 and H2 are smaller than 1 μm, partial lack of the bleed flow blocking parts may occur owing to blurred printing or the like upon formation of the bleed flow blocking parts, so that the flow of bleeds 13a and 14a may not be able to be sufficiently prevented. On the other hand, if the heights H1 and H2 are greater than 100 the width of the piezoelectric actuator 1 along the second direction y will be large, so that the piezoelectric actuator 1 may become difficult to mount on the relevant apparatus. Furthermore, the bleed flow blocking parts 25a, 25b, 26a, and 26b will tend to easily drop. Therefore, the heights H1 and H2 are preferably not greater than 100 μm. More preferably, the heights H1 and H2 are not greater than 50 μm.

In this embodiment, since the bleed flow blocking parts 25a, 25b, 26a, and 26b are formed on the first and second external electrode parts 21b and 22b, the heights of the bleed flow blocking parts 25a, 25b, 26a, and 26b are the heights along the second direction y from the first and second external electrode parts 21b and 22b. Unlike this, if, for example, the bleed flow blocking parts 25a, 25b, 26a, and 26b are not formed on the first and second external electrode parts 21b and 22b, the heights of the bleed flow blocking parts 25a, 25b, 26a, and 26b are the heights along the second direction y from the surface of the displacement part 20.

Hereinafter, other preferred embodiments of the present invention will be described. In the following description of embodiments, elements having functions substantially common to those of elements in the above embodiment are referred to by common reference numerals, and further explanation thereof will be accordingly omitted.

Second Embodiment

Figure 7:
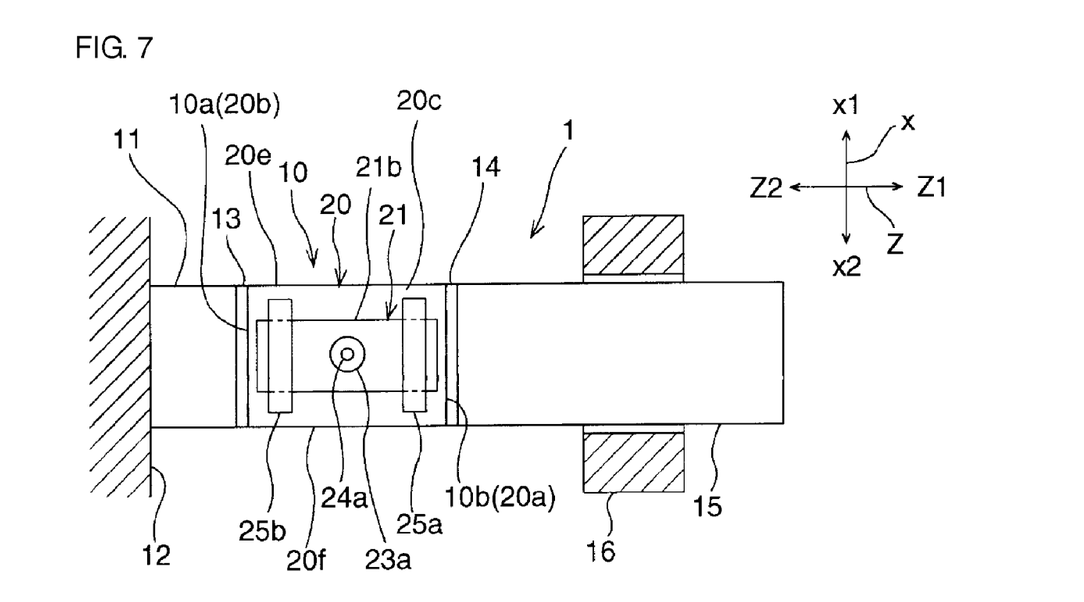
FIG. 7 is a schematic side view of an actuator according to a second embodiment.

FIG. 7 is a schematic side view of an actuator according to a second embodiment. In the above first embodiment, an example is described in which the bleed flow blocking parts 25a, 25b, 26a, and 26b are formed from the respective x1 side ends of the displacement part 20 to the respective x2 side ends thereof. However, the present invention is not limited to this configuration.

For example, as shown in FIG. 7, the bleed flow blocking parts 25a, 25b, 26a, and 26b may be formed to a smaller extent than the entire width of the displacement part 20 from the respective x1 side ends thereof to the respective x2 side ends thereof. Specifically, each of the bleed flow blocking parts 25a, 25b, 26a, and 26b may be formed to be present in the middle of the displacement part 20 in the first direction x and but absent at both ends thereof in the first direction x. Also in this case, because the bleeds 13a and 14a are less likely to reach the midportions of the first and second external electrode parts 21b and 22b, it can be prevented that the solders 23a and 23b are reduced in bondability to the first and second external electrode parts 21b and 22b, respectively. Furthermore, it can be prevented that the electrical resistance between the first and second external electrode parts 21b and 22b and the respective associated solders 23a and 23b is increased.

Third Embodiment

Figure 8:
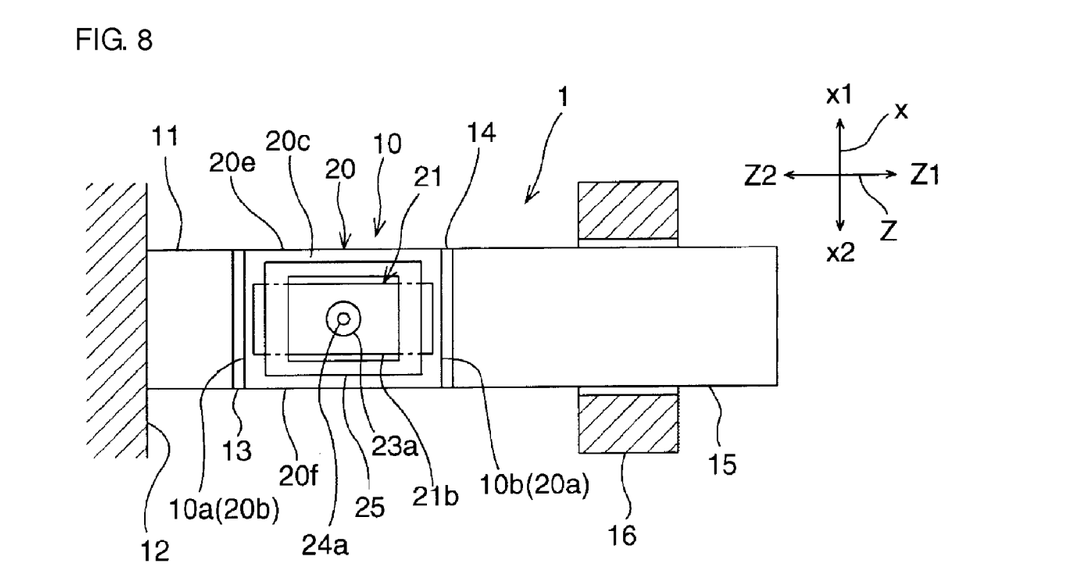
FIG. 8 is a schematic side view of an actuator according to a third embodiment.

FIG. 8 is a schematic side view of an actuator according to a third embodiment. In this embodiment, as shown in FIG. 8, a bleed flow blocking part 25 is formed to surround at least part of the first external electrode part 21b. Although not shown, a bleed flow blocking part is also formed on the second side face 20d to surround at least part of the second external electrode part 22b. Thus, it can be more effectively prevented that bleeds 13a and 14a enter the regions of the first and second external electrode parts 21b and 22b surrounded by the bleed flow blocking parts. As a result, it can be more effectively prevented that the surfaces of the regions of the first and second external electrode parts 21b and 22b surrounded by the bleed flow blocking parts are covered with bleeds 13a and 14a. Therefore, it can be more effectively prevented that the solders 23a and 23b are reduced in bondability to the first and second external electrode parts 21b and 22b, respectively. Furthermore, it can be more effectively prevented that the electrical resistance between the first and second external electrode parts 21b and 22b and the respective associated solders 23a and 23b is increased.

Fourth Embodiment

Figure 9:
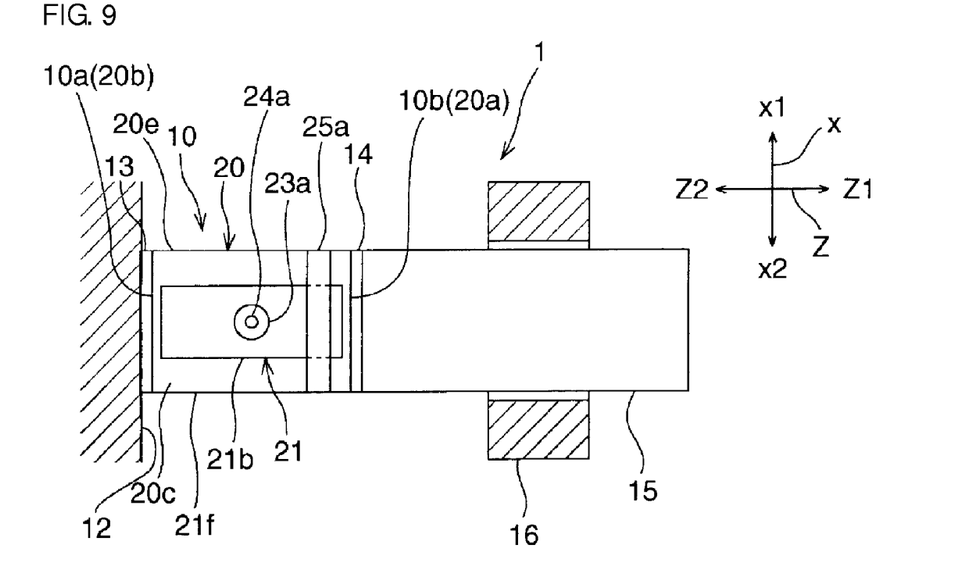
FIG. 9 is a schematic side view of an actuator according to a fourth embodiment.

FIG. 9 is a schematic side view of an actuator according to a fourth embodiment. In the above first embodiment, an example is described in which not only the bleed flow blocking parts 25a and 26a (not shown) located on the Z1 side of the height direction Z but also the bleed flow blocking parts 25b and 26b located on the Z2 side of the height direction Z are provided. However, the present invention is not limited to this structure. For example, only one of the pair of bleed flow blocking parts 25a and 26a and the pair of bleed flow blocking parts 25b and 26b may be provided. In an example shown in FIG. 9, of the two pairs of bleed flow blocking parts 25a, 25b, 26a, and 26b, only the pair of bleed flow blocking parts 25a and 26a are provided. Also in such a case, the bleed flow blocking parts 25a and 26a prevent a bleed 14a from flowing over the bleed flow blocking parts 25a and 26a toward the Z2 side. On the other hand, the flow of a bleed 13a does not matter because the stationary member 12 is bonded to the electromechanical conversion element 10 after the bonding of the lead electrodes 24a and 24b via the solders 23a and 23b to the electromechanical conversion element 10. Therefore, it can be prevented that the solders 23a and 23b are reduced in bondability to the first and second external electrode parts 21b and 22b, respectively. Furthermore, it can be prevented that the electrical resistance between the first and second external electrode parts 21b and 22b and the respective associated solders 23a and 23b is increased.

Fifth Embodiment

Figure 10:
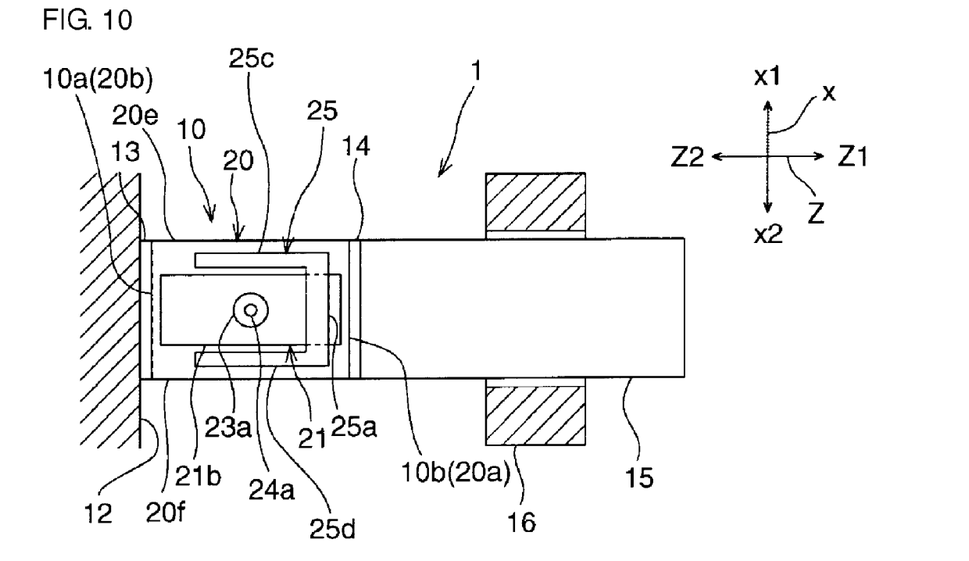
FIG. 10 is a schematic side view of an actuator according to a fifth embodiment.
Figure 11:
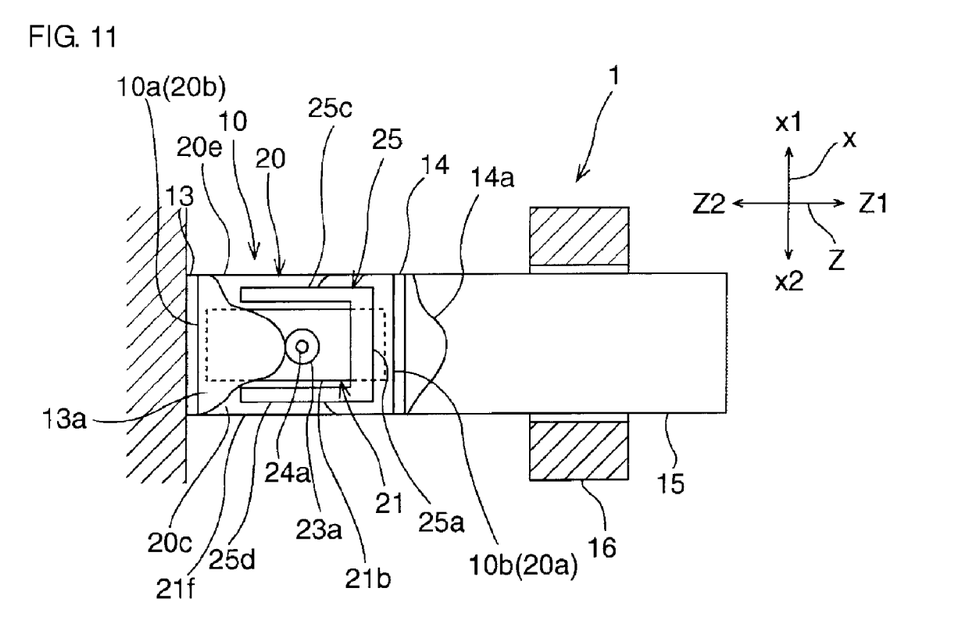
FIG. 11 is a schematic view showing a state that in the actuator according to the fifth embodiment, adhesives have caused bleeding.

FIG. 10 is a schematic side view of an actuator according to a fifth embodiment. In the above fourth embodiment, an example is described in which the bleed flow blocking parts 25a and 26a are formed in the shape of a straight line extending along the first direction x. However, the present invention is not limited to this configuration. For example, as shown in FIG. 10, bleed flow blocking parts 25c and 25d may be further provided which are connected to both ends of the bleed flow blocking part 25a in the first direction x and extend toward the Z2 side of the height direction Z. In other words, the bleed flow blocking part may be formed in a substantially U-shape. In this case, as shown in FIG. 11, the bleed flow blocking parts 25c and 25d effectively block the flows of a bleed 14a from passing to the lateral sides of the bleed flow blocking part 25a in the first direction x and coming around behind the bleed flow blocking part 25a. Thus, it can be more effectively prevented that the bleed 14a reaches the regions of the first and second external electrode parts 21b and 22b surrounded by the substantially U-shaped bleed flow blocking parts. Therefore, it can be more effectively prevented that the solders 23a and 23b (not shown) are reduced in bondability to the first and second external electrode parts 21b and 22b, respectively. Furthermore, it can be more effectively prevented that the electrical resistance between the first and second external electrode parts 21b and 22b and the respective associated solders 23a and 23b is increased. On the other hand, the flow of a bleed 13a does not matter because the stationary member 12 is bonded to the electromechanical conversion element 10 after the bonding of the lead electrodes 24a and 24b via the solders 23a and 23b to the electromechanical conversion element 10.

Sixth Embodiment

Figure 12:
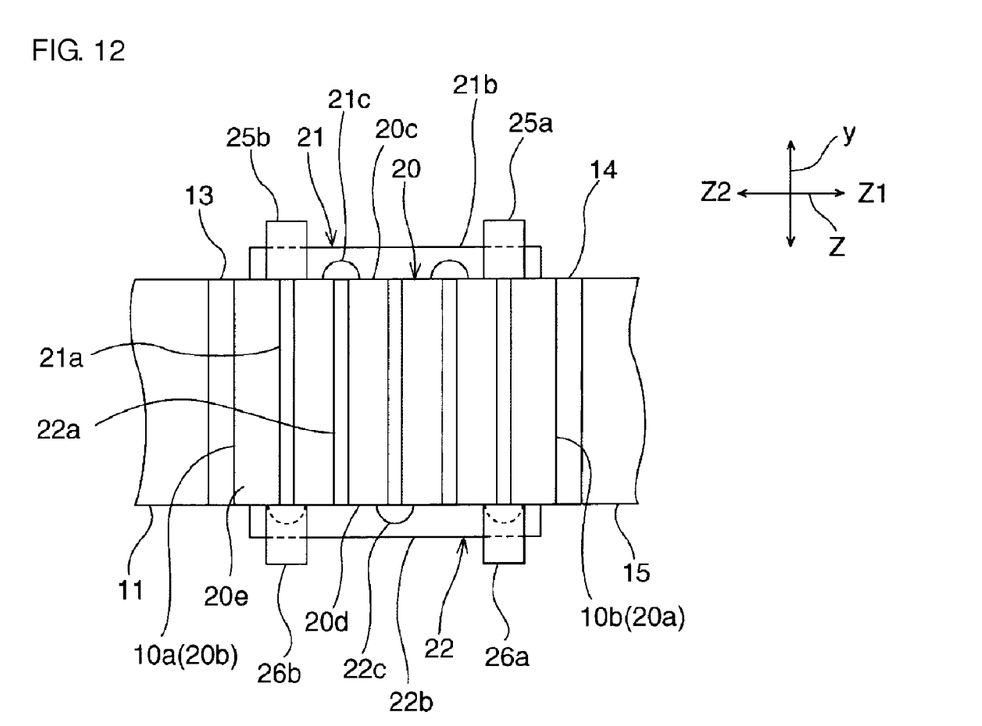
FIG. 12 is a schematic front view of an actuator according to a sixth embodiment.

FIG. 12 is a schematic front view of an actuator according to a sixth embodiment. In the first embodiment, an example is described in which the first internal electrode parts 21a are not exposed on the second side face 20d and the second internal electrode parts 22a are not exposed on the first side face 20c. However, the present invention is not limited to this configuration. For example, a configuration may be employed in which the first internal electrode parts 21a are exposed on the second side face 20d and the second internal electrode parts 22a are exposed on the first side face 20c. In this case, as shown in FIG. 12, insulating parts 21c and 22c are provided to insulate the first internal electrode parts 21a from the second external electrode part 22b and insulate the second internal electrode parts 22a from the first external electrode part 21b.

Experimental Examples

Figure 4:
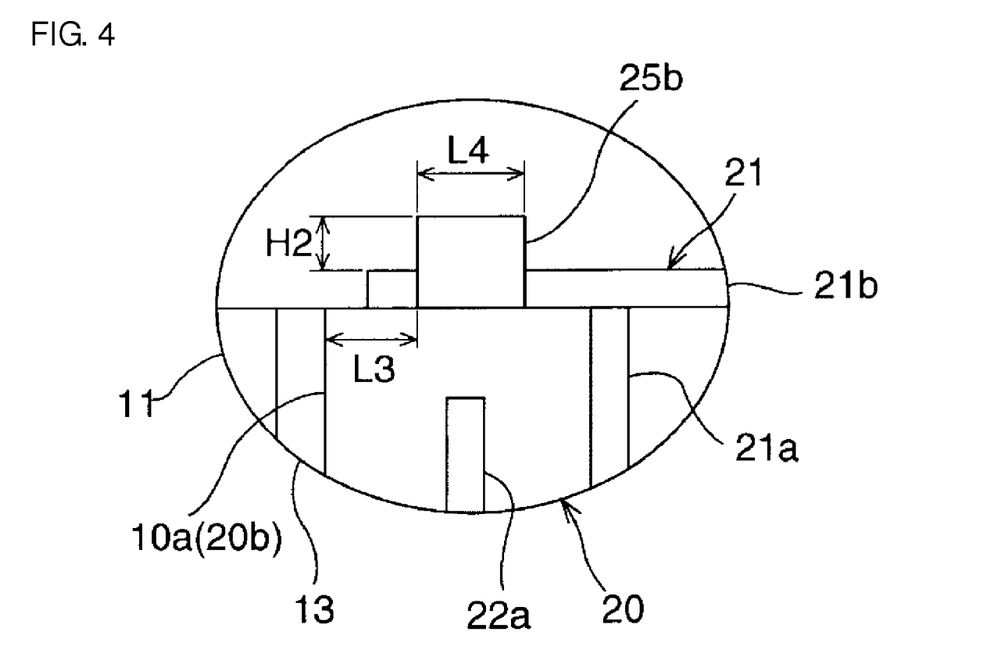
FIG. 4 is a schematic enlarged view of the part IV shown in FIG. 1.

A plurality of samples of the piezoelectric actuator 1 according to the first embodiment shown in FIGS. 1 and 2, although not yet connected to lead electrodes 24a and 24b by solders 23a and 23b, were produced based on the design parameters below by changing the lengths L1 and L3 and heights H1 and H2 shown in FIGS. 3 and 4. Next, for each sample, 0.2 mg of solder cream was applied to the center of the region of the first external electrode part 21b located between the bleed flow blocking parts 25a and 25b. Five minutes after the application, the sample was heated on a hot plate at 250° C. for 5 minutes. Then, the degree of spread of the solder was visually observed. The results are shown in TABLES 1 and 2 below. In TABLES 1 and 2, the evaluation of Grades 1 to 4 is based on the following evaluation criteria.

Grade 4: Solder spread substantially entirely over the region of the first external electrode part 21b located between the bleed flow blocking parts 25a and 25b.

Grade 3: Solder spread to a degree of 70% to 90% of the region of the first external electrode part 21b located between the bleed flow blocking parts 25a and 25b.

Grade 2: Solder spread to a degree of 50% to 70% of the region of the first external electrode part 21b located between the bleed flow blocking parts 25a and 25b.

Grade 1: Solder spread to a degree of below 50% of the region of the first external electrode part 21b located between the bleed flow blocking parts 25a and 25b.

(Design Parameters)

Material of the first external electrode part 21b: Ag

Material of the bleed flow blocking parts 25a and 25b: thermosetting epoxy resin Solder cream: Sn/Ag/Cu-based solder paste Dimensions of the bleed flow blocking parts 25a and 25b: 8 μm in height and 200 μm in width Distance from the end face to the bleed flow blocking parts 25a and 25b: 100 μm

TABLE 1

| | Height H1, H2 (μm) | | | | |
|---|---|---|---|---|---|
| | 0.5 | 1 | 5 | 10 | 30 |
| Grade | 3 | 4 | 4 | 4 | 4 |

TABLE 1 shows that the samples can effectively prevent bleeds 13a and 14a from passing over the bleed flow blocking parts 25a and 25b and reaching the first external electrode part 21b.

TABLE 1 also shows that when the heights H1 and H2 of the bleed flow blocking parts 25a and 25b from the surfaces of the first external electrode part 21b are 1 μm or more, it can be more effectively prevented that bleeds 13a and 14a pass over the bleed flow blocking parts 25a and 25b and reach the first external electrode part 21b. However, when the heights H1 and H2 are below 1 μm, partial lack of the bleed flow blocking parts sometimes occurred owing to blurred printing or the like upon formation of the bleed flow blocking parts, so that the flow of bleeds 13a and 14a could not be sufficiently prevented. These results reveal that the heights H1 and H2 are preferably 1 or more.

TABLE 2

| | Distance L1, L3 (μm) | | | | |
|---|---|---|---|---|---|
| | 10 | 50 | 90 | 100 | 150 |
| Grade | 4 | 4 | 4 | 4 | 4 |

It can be seen from the results shown in TABLE 2 that when the distance L1 from the first end face 20a to the bleed flow blocking part 25a and the distance L3 from the second end face 20b to the bleed flow blocking part 25b are within the range from 10 μm to 150 μm, it can be effectively prevented that bleeds 13a and 14a pass over the bleed flow blocking parts 25a and 25b and reach the first external electrode part 21b.

Furthermore, since the bleed flow blocking parts 25a and 26a are spaced apart from the first end face 20a, it can be prevented that upon formation of the bleed flow blocking parts by screen printing, ink-jet printing or like methods, print misalignment occurs and a paste or ink for forming the bleed flow blocking parts flows around to the end face 20a. Therefore, the distances L1 and L3 are preferably 50 μm or more and more preferably 100 μm or more.

| ReferenceSigns List | |
|---|---|
| 1 | Piezoelectric actuator |
| 10 | Electromechanical conversion element |
| 10a | First end face of electromechanical conversion element |
| 10b | Second end face of electromechanical conversion element |
| 11 | Weight |
| 12 | Stationary member |
| 13, 14 | Adhesive layer |
| 13a, 14a | Bleed |
| 15 | Driven member |
| 16 | Movable body |
| 20 | Displacement part |
| 20a | First end face of displacement part |
| 20b | Second end face of displacement part |
| 20c | First side face of displacement part |
| 20d | Second side face of displacement part |
| 20e | Third side face of displacement part |
| 20f | Fourth side face of displacement part |
| 21 | First electrode |
| 21a | First internal electrode part |
| 21b | First external electrode part |
| 21c, 22c | Insulating part |
| 22 | Second electrode |
| 22a | Second internal electrode part |
| 22b | Second external electrode part |
| 23a, 23b | Solder |
| 24a, 24b | Lead electrode |
| 25, 25a, 25b, 25c, 25d, 26a, 26b | Bleed flow blocking part |

The invention claimed is:

1. An electromechanical conversion element comprising:
a displacement part configured to expand and contract by application of a voltage, the displacement part having an electrode face and an adhesion face which are adjacent to each other;
an external electrode on the electrode face, the external electrode including a bonding region for a lead electrode that supplies the voltage to the displacement part;
a driven member attached to the adhesion face and configured to be driven by the expansion and contraction of the displacement part; and
a bleed flow blocking part on the electrode face between the adhesion face and the bonding region.

2. The electromechanical conversion element according to claim 1, wherein a critical surface tension of the bleed flow blocking part is smaller than that of the external electrode.

3. The electromechanical conversion element according to claim 2, wherein the critical surface tension of the bleed flow blocking part is within a range of 10 to 100 dyn/cm, both inclusive.

4. The electromechanical conversion element according to claim 1, wherein the bleed flow blocking part is a resin.

5. The electromechanical conversion element according to claim 4, wherein the bleed flow blocking part is one of an epoxy resin, an acrylic resin, and a urethane resin.

6. The electromechanical conversion element according to claim 1, wherein the bleed flow blocking part is spaced from an edge of the electrode face proximal to the adhesion face.

7. The electromechanical conversion element according to claim 6, wherein the bleed flow blocking part is spaced 50 μm or more from the edge of the electrode face proximal to the adhesion face.

8. The electromechanical conversion element according to claim 1, wherein a height of the bleed flow blocking part is 1 μm or more.

9. The electromechanical conversion element according to claim 1, wherein as viewed in a direction normal to the electrode face, the external electrode extends across a part of a dimension of the electrode face in a direction parallel to the adhesion face, and the bleed flow blocking part traverses at least a region of the electrode face containing the external electrode.

10. The electromechanical conversion element according to claim 9, wherein the bleed flow blocking part extends from a first end of the electrode face in a direction of extension of the adhesion face to a second end of the electrode face.

11. The electromechanical conversion element according to claim 1, wherein the bleed flow blocking part surrounds at least part of the external electrode.

12. The electromechanical conversion element according to claim 1, wherein
the displacement part is in the shape of a quadrangular prism, has first and second side faces extending along a height direction and a first direction perpendicular to the height direction, third and fourth side faces extending along the height direction and a second direction perpendicular to the height direction and the first direction, and first and second end faces extending along the first and second directions,
the adhesion face is the first end face, and
the electrode face is the first side face.

13. The electromechanical conversion element according to claim 1, wherein the displacement part is a piezoelectric material.

14. An actuator comprising:
the electromechanical conversion element according to claim 1; and
a lead electrode connected to the external electrode.

15. The actuator according to claim 14, further comprising a movable body slidably provided on the driven member, wherein the movable body is configured to be slidingly displaced relative to the driven member by movement of the driven member due to the expansion and contraction of the electromechanical conversion element.

* * * * *